(12) United States Patent
Soga

(10) Patent No.: US 10,148,226 B2
(45) Date of Patent: Dec. 4, 2018

(54) BIAS CIRCUIT

(71) Applicant: Murata Manufacturing Co., Ltd, Kyoto (JP)

(72) Inventor: Takashi Soga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/834,723

(22) Filed: Dec. 7, 2017

(65) Prior Publication Data

US 2018/0167035 A1    Jun. 14, 2018

(30) Foreign Application Priority Data

Dec. 9, 2016  (JP) ................................. 2016-239733
Aug. 4, 2017  (JP) ................................. 2017-151438

(51) Int. Cl.
*G05F 1/10* (2006.01)
*H03F 1/02* (2006.01)
*H03F 3/21* (2006.01)
*H03F 3/19* (2006.01)

(52) U.S. Cl.
CPC ............ *H03F 1/0205* (2013.01); *H03F 1/02* (2013.01); *H03F 3/19* (2013.01); *H03F 3/21* (2013.01); *H03F 2200/165* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 2004/0085130 | A1* | 5/2004 | Luo | .......................... H03F 1/20 330/288 |
| 2005/0179484 | A1* | 8/2005 | Sasho | ..................... G05F 3/205 327/538 |
| 2009/0201084 | A1 | 8/2009 | See et al. | |
| 2015/0349715 | A1 | 12/2015 | Gerard et al. | |
| 2016/0190995 | A1 | 6/2016 | Penticoff | |

FOREIGN PATENT DOCUMENTS

| | | | |
|---|---|---|---|
| TW | 201004129 | A1 | 1/2010 |
| TW | 20115909 | A | 2/2011 |
| WO | 2010/140109 | A3 | 12/2010 |

* cited by examiner

*Primary Examiner* — Long Nguyen
(74) *Attorney, Agent, or Firm* — Pearne & Gordon LLP

(57) ABSTRACT

A bias circuit includes first to fourth bipolar transistors and a filter circuit. The third bipolar transistor supplies a bias signal to an amplifier. The filter circuit is connected between a collector terminal of the first bipolar transistor and the ground through a base terminal of the first bipolar transistor. The filter circuit has frequency characteristics for attenuating a high frequency component of an RF signal to be input to the amplifier.

4 Claims, 8 Drawing Sheets

BIAS CIRCUIT

This application claims priority from Japanese Patent Application No. 2017-151438 filed on Aug. 4, 2017 and Japanese Patent Application No. 2016-239733 filed Dec. 9, 2016. The content of this application is incorporated herein by reference in its entirety.

BACKGROUND

The present disclosure relates to a bias circuit. A power amplifier that amplifies a radio frequency (RF) signal to be transmitted to a base station is used in a mobile communication terminal such as a cellular phone. The power amplifier includes a transistor that amplifies the RF signal and a bias circuit that controls a bias point of the transistor. As this type of bias circuit, a bias circuit using a current mirror circuit is known as described in, for example, U.S. Patent Application Publication No. 2015/0349715. In addition, as this type of transistor, a heterojunction bipolar transistor is known.

However, a heterojunction bipolar transistor has a large thermal resistance, and thus generates heat as an RF signal output increases, thereby resulting in a lower transconductance. As the transconductance decreases, the gain of the power amplifier decreases. When the RF signal output further increases, the bias point of the heterojunction bipolar transistor increases, and thus the gain of the power amplifier turns to an increase pattern from a decrease pattern. In this manner, the linearity of the power amplifier deteriorates due to changes in the gain of the power amplifier in its low and middle output region. Such linearity deterioration distorts the RF signal, and thus it is not desirable especially for a communication system using a linear modulation scheme.

BRIEF SUMMARY

The present disclosure proposes a bias circuit that improves a nonlinear operation of an amplifier.

According to embodiments of the present disclosure, a bias circuit includes (i) a first bipolar transistor that has a first collector terminal, a first emitter terminal, and a first base terminal, the first collector terminal being connected to a power source terminal through a first current path, the first emitter terminal being grounded, (ii) a second bipolar transistor that has a second collector terminal, a second emitter terminal, and a second base terminal, the second collector terminal being connected to a constant voltage source or a constant current source through a second current path, the second emitter terminal being grounded, the second base terminal being connected to the first base terminal, (iii) a third bipolar transistor that has a third base terminal, a third collector terminal, and a third emitter terminal, the third collector terminal being connected to the power source terminal through the first current path, the third emitter terminal being connected to the first collector terminal through the first current path and supplying a bias signal to an amplifier, (iv) a fourth bipolar transistor that has a fourth base terminal, a fourth collector terminal, and a fourth emitter terminal, the fourth base terminal being connected to the third base terminal, the fourth collector terminal being connected to the constant voltage source or the constant current source through the second current path, the fourth emitter terminal being connected to the second collector terminal through the second current path, the fourth collector terminal being connected to the fourth base terminal, and (v) a filter circuit that is connected between the first collector terminal and the ground through the first base terminal and that has a frequency characteristic for attenuating a high frequency component of an RF signal to be input to the amplifier.

According to the bias circuit according to the embodiments of the present disclosure, the nonlinear operation of the amplifier may be improved.

Other features, elements, and characteristics of the present disclosure will become more apparent from the following detailed description of embodiments of the present disclosure (with reference to the attached drawings).

DESCRIPTION OF THE EMBODIMENTS

Figure 1:
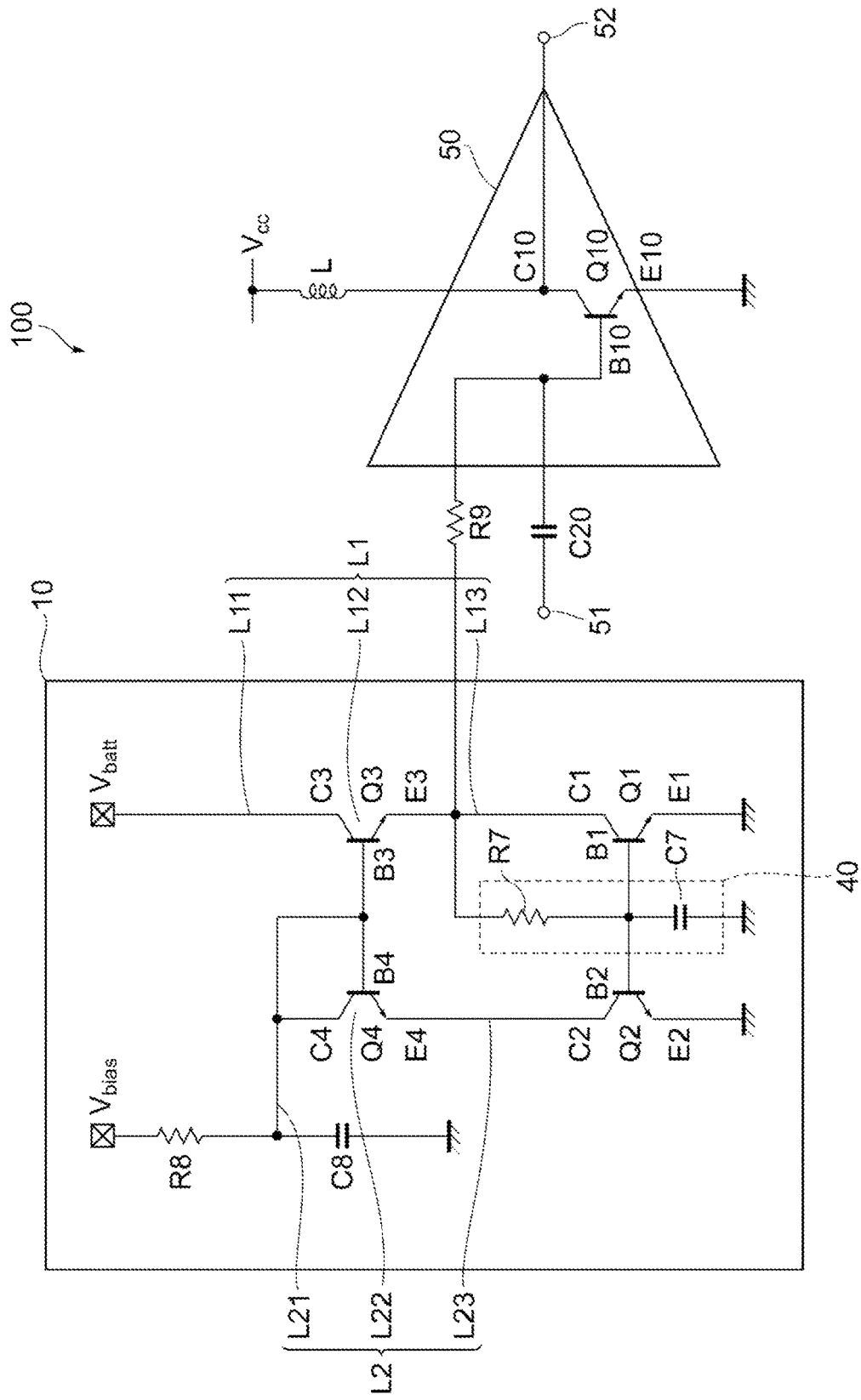
FIG. 1 is a diagram for describing a circuit configuration of a power amplifier associated with a first embodiment of the present disclosure.

In the following, embodiments of the present disclosure will be described with reference to the drawings. Here, the same reference numeral indicates the same circuit element, and a redundant description thereof will be omitted.

FIG. 1 is a diagram for describing a circuit configuration of a power amplifier 100 associated with a first embodiment of the present disclosure. The power amplifier 100 amplifies, in a mobile communication terminal such as a cellular phone, an RF signal to be transmitted to a base station. The power amplifier 100 includes an amplifier 50 and a bias circuit 10. The amplifier 50 amplifies an RF signal, and the bias circuit 10 supplies a bias signal to the amplifier 50. The amplifier 50 has an input terminal 51, a bipolar transistor Q10, and an output terminal 52. A base terminal B10 of the bipolar transistor Q10 receives an RF signal through the input terminal 51 and a capacitor element C20. A collector terminal C10 of the bipolar transistor Q10 receives a power source voltage Vcc applied through an inductor element L. An emitter terminal E10 of the bipolar transistor Q10 is grounded. The bipolar transistor Q10 amplifies the RF signal input to the base terminal B10, and outputs the amplified RF signal from the collector terminal C10 toward the output terminal 52. As the bipolar transistor Q10, for example, a heterojunction bipolar transistor may be used.

The bias circuit 10 mainly includes a bipolar transistor Q1 (a first bipolar transistor), a bipolar transistor Q2 (a second bipolar transistor), a bipolar transistor Q3 (a third bipolar transistor), a bipolar transistor Q4 (a fourth bipolar transistor), and a filter circuit 40.

A base terminal B1 (a first base terminal) of the bipolar transistor Q1 is connected to a base terminal B2 (a second base terminal) of the bipolar transistor Q2. A collector terminal C1 (a first collector terminal) of the bipolar transistor Q1 is connected to an emitter terminal E3 (a third emitter terminal) of the bipolar transistor Q3. An emitter terminal E1 (a first emitter terminal) of the bipolar transistor Q1 is grounded.

A collector terminal C2 (a second collector terminal) of the bipolar transistor Q2 is connected to an emitter terminal E4 (a fourth emitter terminal) of the bipolar transistor Q4. An emitter terminal E2 (a second emitter terminal) of the bipolar transistor Q2 is grounded.

A base terminal B3 (a third base terminal) of the bipolar transistor Q3 is connected to a base terminal B4 (a fourth base terminal) of the bipolar transistor Q4. A collector terminal C3 (a third collector terminal) of the bipolar transistor Q3 is connected to a power source terminal Vbatt. The emitter terminal E3 (the third emitter terminal) of the bipolar transistor Q3 is connected to the base terminal B10 of the bipolar transistor Q10 through a base ballast resistor R9.

A collector terminal C4 (a fourth collector terminal) of the bipolar transistor Q4 is connected to a constant voltage source Vbias through a resistive element R8, and is also grounded through a capacitor element C21. The base terminal B4 of the bipolar transistor Q4 is connected to the collector terminal C4. Note that a constant current source may be used instead of the constant voltage source Vbias. Hereinafter a constant voltage source will be shown by example in cases where either of a constant voltage source and a constant current source may be used herein; however, the constant voltage source may be replaced with a constant current source.

In this case, the power source terminal Vbatt is a terminal through which a power source voltage is applied from a battery (for example, a lithium-ion battery). The constant voltage source Vbias applies, as a constant voltage value, a power source voltage from a battery (for example, a lithium-ion battery) regardless of the magnitude of the impedance of a load. In the case where a constant current source is used instead of the constant voltage source Vbias, the constant current source supplies, as a constant current value, a power source current from a battery (for example, a lithium-ion battery) regardless of the magnitude of the impedance of the load. In addition, the collector terminal C1 of the bipolar transistor Q1 is connected to the power source terminal Vbatt through a current path L1 (a first current path). The current path L1 includes current paths L11, L12, and L13. The current path L11 is a current path between the power source terminal Vbatt and the collector terminal C3. The current path L12 is a current path between the collector terminal C3 and the emitter terminal E3. The current path L13 includes a current path between the emitter terminal E3 and the collector terminal C1, a current path between the emitter terminal E3 and a resistive element R7, and a current path between the emitter terminal E3 and the base terminal B10.

Likewise, the collector terminal C2 of the bipolar transistor Q2 is connected to the constant voltage source Vbias through a current path L2 (a second current path). The current path L2 includes current paths L21, L22, and L23. The current path L21 is a current path between the constant voltage source Vbias and the collector terminal C4. The current path L22 is a current path between the collector terminal C4 and the emitter terminal E4. The current path L23 is a current path between the emitter terminal E4 and the collector terminal C2.

The bipolar transistors Q3 and Q4, as a pair, serve as a current mirror, and the value of the current flowing in the current path L1 is almost the same as or is proportional to that of the current flowing in the current path L2.

The emitter terminal E3 of the bipolar transistor Q3 applies a bias current or a bias voltage serving as the bias signal to the amplifier 50. The bias signal is supplied to the base terminal B10 of the bipolar transistor Q10, and controls a bias point of the bipolar transistor Q10.

The filter circuit 40 includes the resistive element R7 connected between the collector terminal C1 and the base terminal B1, and a capacitor element C22 connected between the base terminal B1 and the ground. With this circuit configuration, the filter circuit 40 serves as a low pass filter having frequency characteristics for attenuating high frequency components of an RF signal to be input to the amplifier 50. High frequency components of an RF signal to be supplied to the base terminal B10 of the bipolar transistor Q10 are input to the collector terminal C1. Since the filter circuit 40 has frequency characteristics for attenuating high frequency components of an RF signal, changes in the electric potential of the base terminal B1 due to the effect of the high frequency components of the RF signal to be input to the collector terminal C1 may be reduced. As a result, a stable bias signal may be supplied to the amplifier 50.

Figure 6:
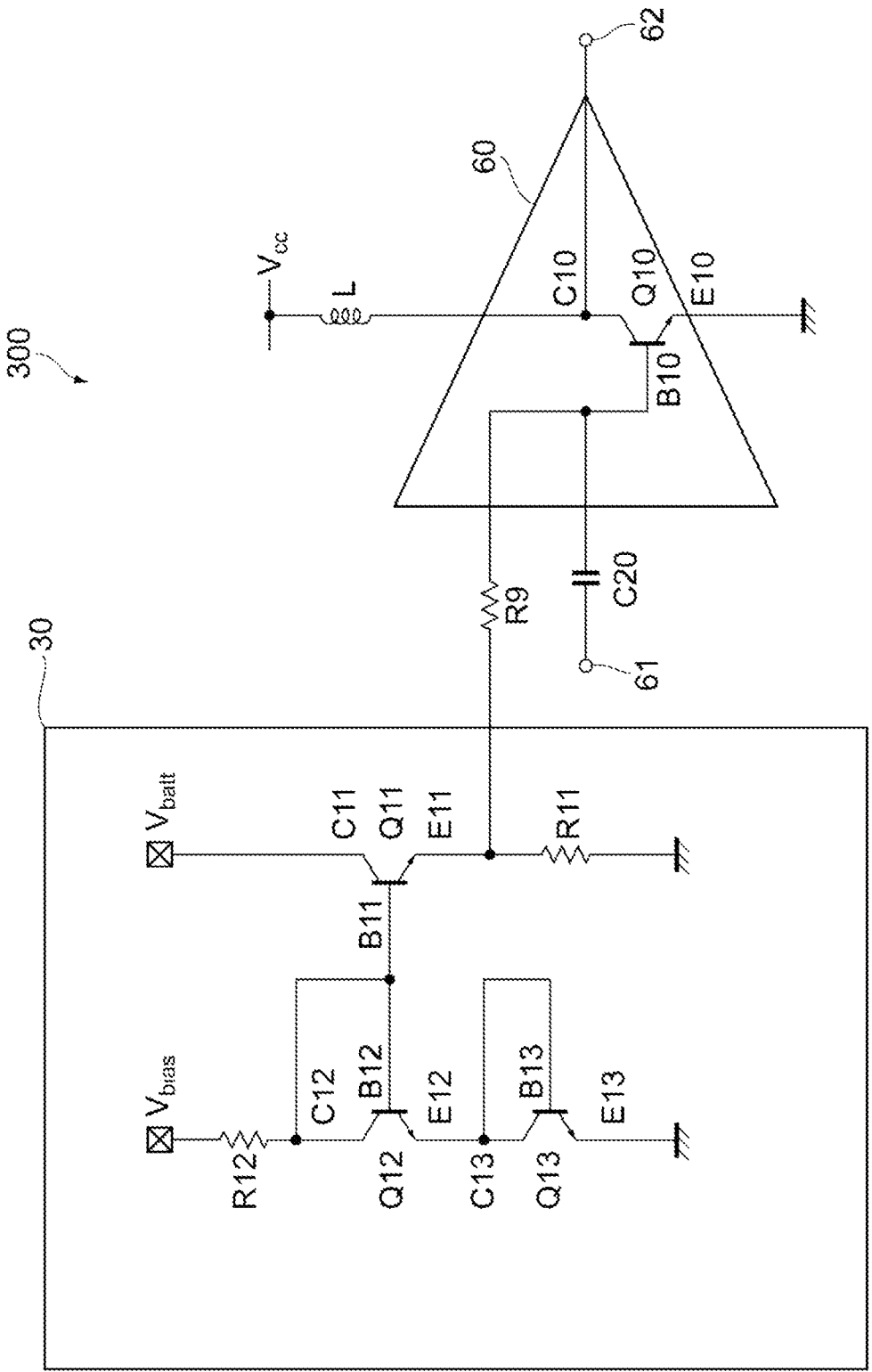
FIG. 6 is a diagram for describing a circuit configuration of a power amplifier associated with the comparison example.

Next, the principles of improvement of a nonlinear operation of the amplifier 50 will be described with reference to FIGS. 2 to 4 and FIG. 6. In this case, FIG. 6 illustrates a circuit configuration of a power amplifier 300 associated with a comparison example. The power amplifier 300 includes an amplifier 60 and a bias circuit 30. The amplifier 60 amplifies an RF signal, and the bias circuit 30 supplies a bias signal to the amplifier 60. The amplifier 60 has an input terminal 61, a bipolar transistor Q10, and an output terminal 62. The input terminal 61 and the output terminal 62 of FIG. 6 have the same functions as the input terminal 51 and the output terminal 52 of FIG. 1, respectively, and thus the detailed description thereof will be omitted.

The bias circuit 30 mainly includes bipolar transistors Q11, Q12, and Q13. A base terminal B11 of the bipolar transistor Q11 is connected to a base terminal B12 of the bipolar transistor Q12. An emitter terminal E11 of the bipolar transistor Q11 is grounded through a resistive element R11, and supplies the bias signal to the amplifier 60 through the emitter terminal E11. A collector terminal C11 of the bipolar transistor Q11 is connected to the power source terminal Vbatt. The bipolar transistor Q11 operates as an emitter follower.

The base terminal B12 of the bipolar transistor Q12 is connected to a collector terminal C12 of the bipolar transistor Q12. The collector terminal C12 of the bipolar transistor Q12 is connected to the constant voltage source Vbias through a resistive element R12. An emitter terminal E12 of the bipolar transistor Q12 is connected to a collector terminal C13 of the bipolar transistor Q13.

A base terminal B13 of the bipolar transistor Q13 is connected to the collector terminal C13 of the bipolar transistor Q13. An emitter terminal E13 of the bipolar transistor Q13 is grounded.

Figure 2:
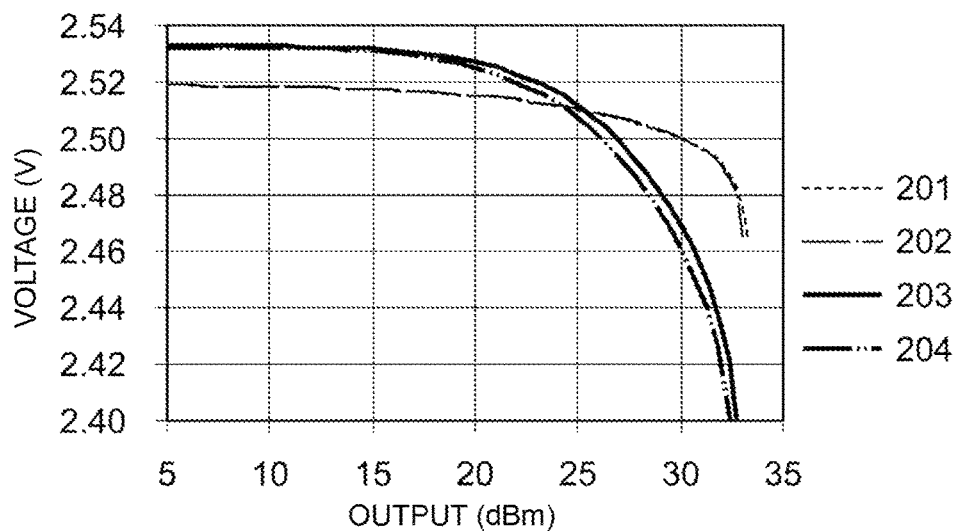
FIG. 2 is a graph illustrating, regarding bias circuits and amplifiers associated with the first embodiment and a comparison example, a relationship between a bias voltage of a bipolar transistor of each bias circuit and the output of a corresponding one of the amplifiers.

FIG. 2 is a graph illustrating, regarding amplifiers and bias circuits, a relationship between the output of each amplifier and a bias voltage of a corresponding one of the bias circuits. The horizontal axis of FIG. 2 represents the output of each amplifier, and the vertical axis of FIG. 2 represents the bias voltage of each bias circuit. Reference numerals 201 and 202 indicate a relationship between the output of the amplifier 60 according to the comparison example illustrated in FIG. 6 and a bias voltage of the base terminal B11 of the bipolar transistor Q11 of the bias circuit 30. In particular, the reference numeral 201 indicates a graph for the case where the frequency of the RF signal is 824 MHz, and the reference numeral 202 indicates a graph for the case where the frequency of the RF signal is 915 MHz. In contrast, reference numerals 203 and 204 indicate a relationship between the output of the amplifier 50 according to the first embodiment illustrated in FIG. 1 and a bias voltage of the base terminal B3 of the bipolar transistor Q3 of the bias circuit 10. In particular, the reference numeral 203 indicates a graph for the case where the frequency of the RF signal is 824 MHz, and the reference numeral 204 indicates a graph for the case where the frequency of the RF signal is 915 MHz.

These results show that, for each of the amplifiers 50 and 60, the difference between the bias voltages due to the difference between the frequencies of the RF signal is small at the same output of the amplifier. In addition, in the graphs indicated by the reference numerals 203 and 204 according to the first embodiment, the bias voltages of the base terminal of the bias circuit decrease more sharply as the level of the output of the amplifier increases than in the graphs indicated by the reference numerals 201 and 202 according to the comparison example.

Figure 3:
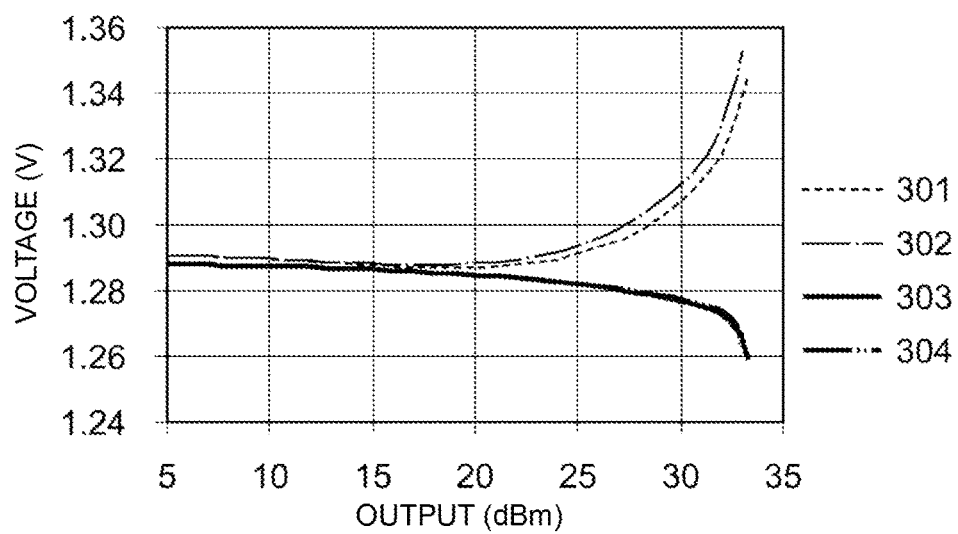
FIG. 3 is a graph illustrating, regarding the bias circuits and amplifiers associated with the first embodiment and the comparison example, a relationship between a bias voltage of a bipolar transistor of each bias circuit and the output of a corresponding one of the amplifiers.

FIG. 3 is a graph illustrating, regarding amplifiers and bias circuits, a relationship between the output of each amplifier and a bias voltage of a corresponding one of the bias circuits. The horizontal axis of FIG. 3 represents the output of each amplifier, and the vertical axis of FIG. 3 represents the bias voltage of each bias circuit. Reference numerals 301 and 302 indicate a relationship between the output of the amplifier 60 according to the comparison example illustrated in FIG. 6 and a bias voltage of the emitter terminal E11 of the bipolar transistor Q11 of the bias circuit 30. In particular, the reference numeral 301 indicates a graph for the case where the frequency of the RF signal is 824 MHz, and the reference numeral 302 indicates a graph for the case where the frequency of the RF signal is 915 MHz. In contrast, reference numerals 303 and 304 indicate a relationship between the output of the amplifier 50 according to the first embodiment illustrated in FIG. 1 and a bias voltage of the emitter terminal E3 of the bipolar transistor Q3 of the bias circuit 10. In particular, the reference numeral 303 indicates a graph for the case where the frequency of the RF signal is 824 MHz, and the reference numeral 304 indicates a graph for the case where the frequency of the RF signal is 915 MHz.

These results show that, for each of the amplifiers 50 and 60, the difference between the bias voltages due to the difference between the frequencies of the RF signal is small at the same output of the amplifier. However, the graphs indicated by the reference numerals 301 and 302 according to the comparison example show that the bias voltage of the emitter terminal E11 of the bipolar transistor Q11 gradually decreases and then increases as the output of the amplifier 60 increases. It is considered that this is caused by increases in the temperature of the bipolar transistor Q11 as the output of the amplifier 60 increases and diode characteristics of the bipolar transistor Q11. In contrast, in the graphs indicated by the reference numerals 303 and 304 according to the first embodiment, the bias voltages gradually decrease as the output of the amplifier 50 increases. This is because a bias voltage of the base terminal B1 of the bipolar transistor Q1 increases through the resistive element R7 when the bias voltage of the emitter terminal E3 of the bipolar transistor Q3 increases as the output of the amplifier 50 increases. As a result, the bipolar transistor Q1 entering an ON state helps to prevent the bias voltage of the emitter terminal E3 of the bipolar transistor Q3 from increasing. Furthermore, when the bias voltage of the emitter terminal E3 of the bipolar transistor Q3 increases, a bias voltage of the base terminal B2 of the bipolar transistor Q2 also increases. The current flowing in the bipolar transistor Q2 then increases, and the voltage of the collector terminal C4 of the bipolar transistor Q4 decreases. As a result, the bias voltage of the base terminal B3 of the bipolar transistor Q3 decreases as illustrated in the graphs indicated by the reference numerals 203 and 204 in FIG. 2. Thus, a negative feedback acts in which the current flowing in the bipolar transistor Q3 decreases and this decrease helps to prevent the voltage of the emitter terminal E3 of the bipolar transistor Q3 from increasing. This also helps to prevent, in the bias circuit 10, the voltage of the emitter terminal E3 of the bipolar transistor Q3 from increasing.

Figure 4:
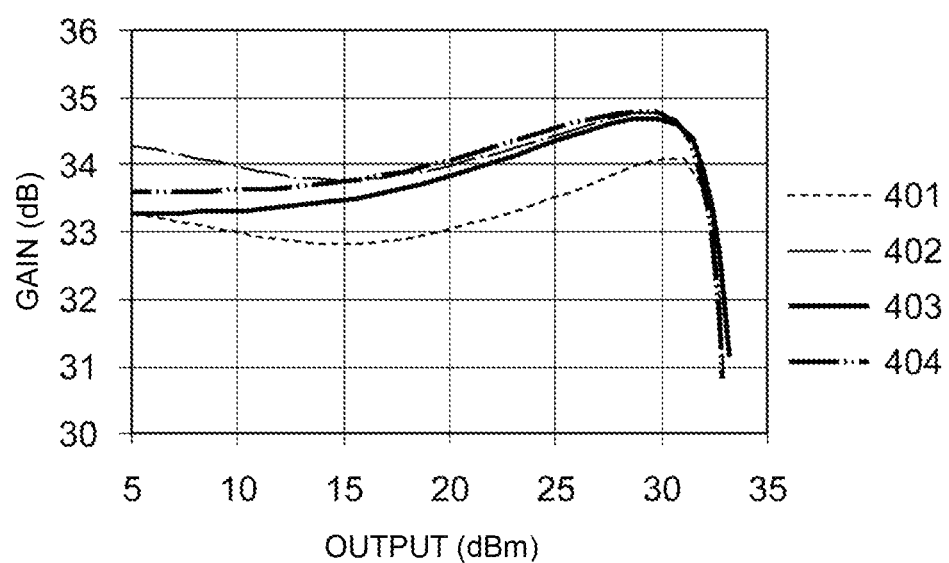
FIG. 4 is a graph illustrating, regarding the amplifiers associated with the first embodiment and the comparison example, a relationship between the gain and output of each amplifier.

FIG. 4 is a graph illustrating, regarding amplifiers, a relationship between the output and gain of each amplifier. The horizontal axis of FIG. 4 represents the output of each amplifier, and the vertical axis of FIG. 4 represents the gain of each amplifier. Reference numerals 401 and 402 indicate a relationship between the output and gain of the amplifier 60 according to the comparison example illustrated in FIG. 6. In particular, the reference numeral 401 indicates a graph for the case where the frequency of the RF signal is 824 MHz, and the reference numeral 402 indicates a graph for the case where the frequency of the RF signal is 915 MHz. Reference numerals 403 and 404 indicate a relationship between the output and gain of the amplifier 50 according to the first embodiment illustrated in FIG. 1. In particular, the reference numeral 403 indicates a graph for the case where the frequency of the RF signal is 824 MHz, and the reference numeral 404 indicates a graph for the case where the frequency of the RF signal is 915 MHz.

As is clear from the graphs indicated by the reference numerals 401 and 402, as the output of the amplifier 60 increases, the transconductance decreases and the gain of the amplifier 60 decreases for a certain period due to heat generated by the bipolar transistor Q10 included in the amplifier 60. However, the bias voltage of the emitter terminal E11 of the bipolar transistor Q11 increases as the output of the amplifier 60 increases as illustrated in the graphs indicated by the reference numerals 301 and 302 of FIG. 3. In this case, a bias voltage of the base terminal B10 of the bipolar transistor Q10 included in the amplifier 60 is equivalent to the voltage obtained by subtracting a voltage drop across the base ballast resistor R9 from the bias voltage of the emitter terminal E11 of the bipolar transistor Q11. Thus, as the bias voltage of the base terminal B10 of the bipolar transistor Q10 included in the amplifier 60 increases, the gain of the amplifier 60 turns to an increase pattern from a decrease pattern. In this manner, the linearity of the amplifier 60 deteriorates due to changes in the gain of the amplifier 60 in its low and middle output region. In contrast, changes in the gain of the amplifier 50 due to increases in the output of the amplifier 50 are smaller than changes in the gain of the amplifier 60 due to increases in the output of the amplifier 60 as illustrated in the graphs indicated by the reference numerals 403 and 404. This is caused by gradual decreases and small changes in the bias voltage of the emitter terminal E3 of the bipolar transistor Q3 as the output of the amplifier 50 increases as illustrated in the graphs indicated by the reference numerals 303 and 304. In this case, the bias voltage of the base terminal B10 of the bipolar transistor Q10 included in the amplifier 50 is equivalent to the voltage obtained by subtracting a voltage drop across the base ballast resistor R9 from the bias voltage of the emitter terminal E3 of the bipolar transistor Q3. Thus, even when the output of the amplifier 50 increases, the bias voltage of the base terminal B10 of the bipolar transistor Q10 included in the amplifier 50 does not change much. Consequently, the gain of the amplifier 50 does not change much as the output of the amplifier 50 increases. According to the first embodiment, the deterioration of the linearity of the amplifier 50 caused by changes in the gain of the amplifier 50 in its low and middle output region may be prevented in this manner.

According to the bias circuit 10 of the first embodiment, when the bias voltage of the emitter terminal E3 of the bipolar transistor Q3 increases as the output of the amplifier 50 increases, the bias voltage of the base terminal B1 of the bipolar transistor Q1 increases, and thus the bipolar transistor Q1 enters the ON state. Furthermore, the bias voltage of the base terminal B2 of the bipolar transistor Q2 also increases, and thus a negative feedback acts in which the current flowing in the bipolar transistor Q2 increases and a bias voltage of the collector terminal C4 of the bipolar transistor Q4 (that is, the bias voltage of the base terminal B3 of the bipolar transistor Q3) decreases. Both of these effects help to prevent the voltage of the emitter terminal E3 of the bipolar transistor Q3 from increasing. In the bias circuit 10, the bias voltage of the emitter terminal E3 of the bipolar transistor Q3 may be prevented from increasing as the output of the amplifier 50 increases in this manner, and by extension the nonlinear operation of the amplifier 50 may be improved. In addition, since the bias circuit 10 is constituted by the bipolar transistors Q1, Q2, Q3, and Q4, the bias circuit 10 may be manufactured by a bipolar process.

Figure 5:
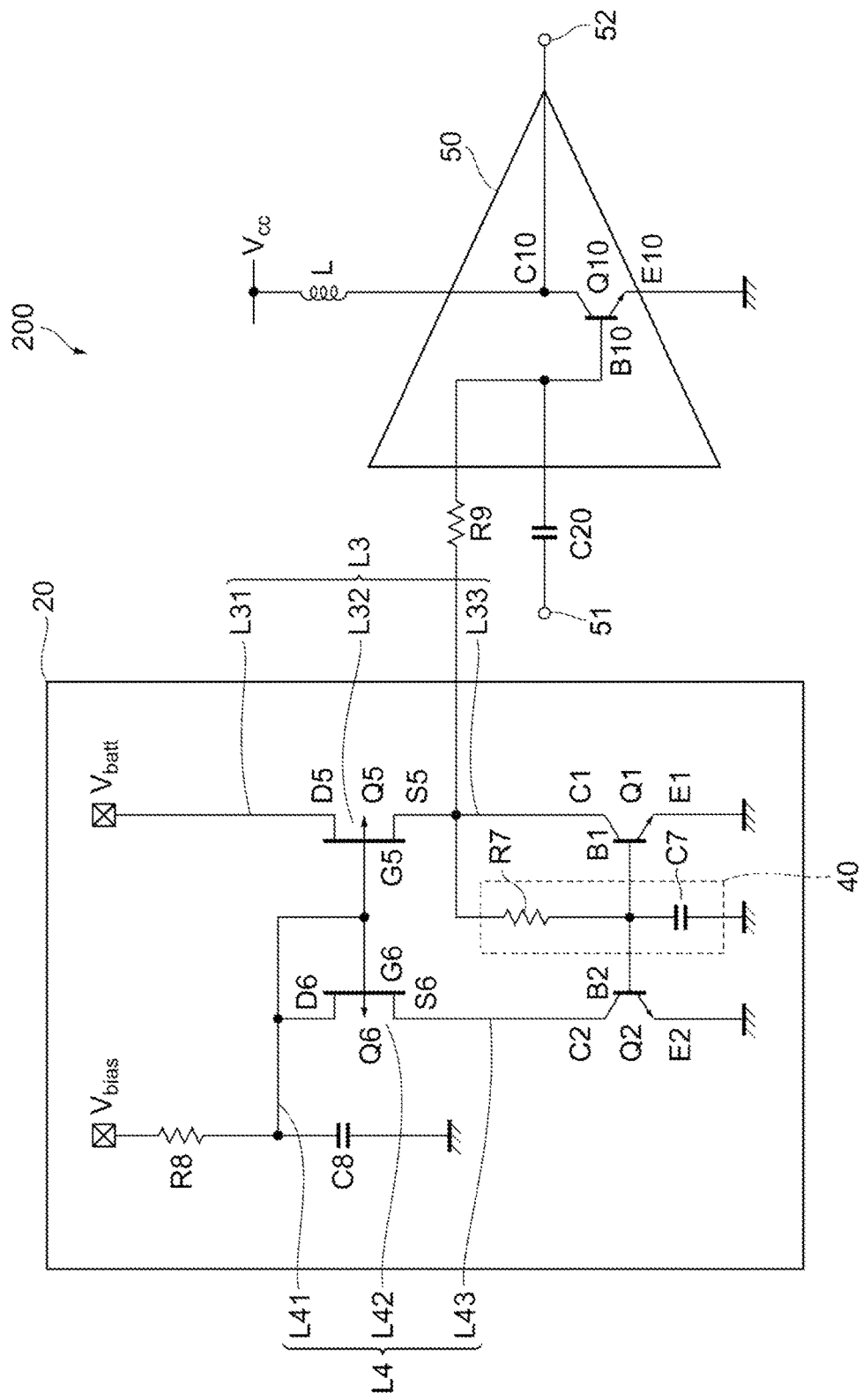
FIG. 5 is a diagram for describing a circuit configuration of a power amplifier associated with a second embodiment of the present disclosure.

FIG. 5 is a diagram for describing a circuit configuration of a power amplifier 200 associated with a second embodiment of the present disclosure. A bias circuit 20 of the power amplifier 200 differs from the bias circuit 10 according to the first embodiment in that the bias circuit 20 is manufactured by a BiFET process and the bias circuit 10 is manufactured by the bipolar process. In this case, the "BiFET process" refers to a manufacturing process by which a bipolar transistor and a field-effect transistor are formed on the same substrate. In addition, the field-effect transistor may be a junction field-effect transistor or an insulated gate field-effect transistor (metal-oxide-semiconductor field-effect transistor). In the following description, differences between the first and second embodiments will be mainly described, and the description of circuit elements common to the first and second embodiments will be omitted.

The power amplifier 200 includes the amplifier 50 and the bias circuit 20. The amplifier 50 amplifies an RF signal, and the bias circuit 20 supplies a bias signal to the amplifier 50. The bias circuit 20 includes field-effect transistors Q5 and Q6 instead of the bipolar transistors Q3 and Q4 of the bias circuit 10 according to the first embodiment.

A gate terminal G5 (first gate terminal) of the field-effect transistor Q5 (first field-effect transistor) is connected to a gate terminal G6 (second gate terminal) of the field-effect transistor Q6 (second field-effect transistor). A source terminal S5 (first source terminal) of the field-effect transistor Q5 is connected to the collector terminal C1 of the bipolar transistor Q1. A drain terminal D5 (first drain terminal) of the field-effect transistor Q5 is connected to the power source terminal Vbatt. The source terminal S5 of the field-effect transistor Q5 is connected to the base terminal B10 of the bipolar transistor Q10 through the base ballast resistor R9.

The gate terminal G6 of the field-effect transistor Q6 is connected to a drain terminal D6 (second drain terminal) of the field-effect transistor Q6. The drain terminal D6 of the field-effect transistor Q6 is connected to the constant voltage source Vbias through the resistive element R8, and is also grounded through the capacitor element C21. A source terminal S6 (second source terminal) of the field-effect transistor Q6 is connected to the collector terminal C2 of the bipolar transistor Q2.

The collector terminal C1 of the bipolar transistor Q1 is connected to the power source terminal Vbatt through a current path L3 (first current path). The current path L3 includes current paths L31, L32, and L33. The current path L31 is a current path between the power source terminal Vbatt and the drain terminal D5. The current path L32 is a current path between the drain terminal D5 and the source terminal S5. The current path L33 includes a current path between the source terminal S5 and the collector terminal C1, a current path between the source terminal S5 and the resistive element R7, and a current path between the source terminal S5 and the base terminal B10.

Likewise, the collector terminal C2 of the bipolar transistor Q2 is connected to the constant voltage source Vbias through a current path L4 (second current path). The current path L4 includes current paths L41, L42, and L43. The current path L41 is a current path between the constant voltage source Vbias and the drain terminal D6. The current path L42 is a current path between the drain terminal D6 and the source terminal S6. The current path L43 is a current path between the source terminal S6 and the collector terminal C2.

The field-effect transistors Q5 and Q6, as a pair, serve as a current mirror, and the value of the current flowing in the current path L3 is almost the same as or is proportional to that of the current flowing in the current path L4.

The field-effect transistors Q5 and Q6 of the second embodiment are operable at lower threshold voltages than the bipolar transistors Q3 and Q4 of the first embodiment. As a result, the power consumption of a battery that applies a power-source voltage to the power source terminal Vbatt and the constant voltage source Vbias may be reduced, and the bias circuit 20 may be operated at low voltages. In addition, a mobile communication terminal such as a cellular phone including the power amplifier 200 may have a longer talk time. In addition, since the bias circuit 20 according to the second embodiment has a circuit configuration similar to that of the bias circuit 10 according to the first embodiment, the nonlinear operation of the amplifier 50 may also be improved.

Figure 7:
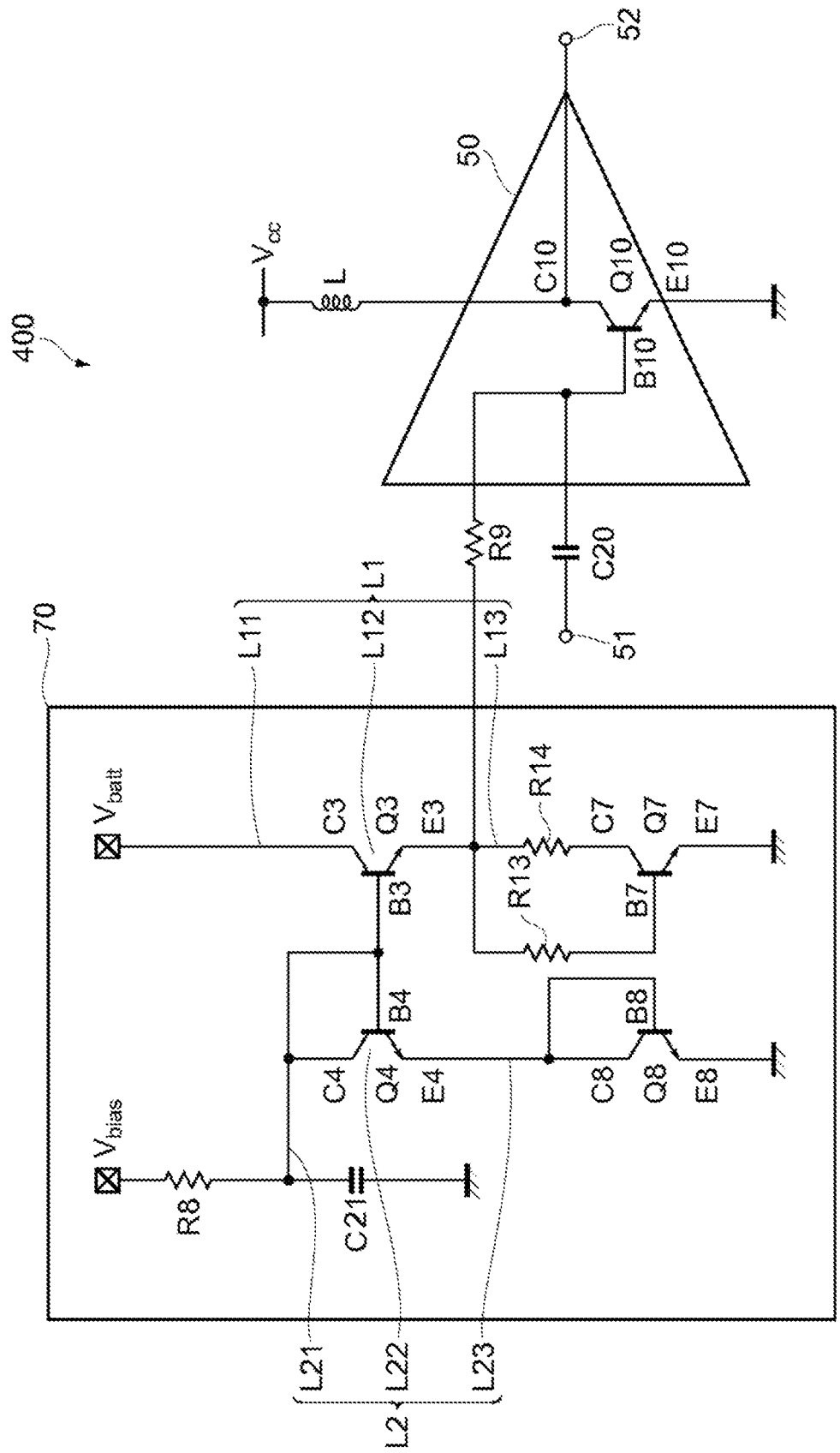
FIG. 7 is a diagram for describing a circuit configuration of a power amplifier associated with a third embodiment of the present disclosure.

FIG. 7 is a diagram for describing a circuit configuration of a power amplifier 400 associated with a third embodiment of the present disclosure. A bias circuit 70 of the power amplifier 400 includes bipolar transistors Q7 and Q8 and resistive elements R13 and R14 instead of the bipolar transistors Q1 and Q2.

A base terminal B7 (first base terminal) of the bipolar transistor Q7 (first bipolar transistor) is connected to the emitter terminal E3 of the bipolar transistor Q3 through a resistive element R13. A collector terminal C7 (first collector terminal) of the bipolar transistor Q7 is connected to the emitter terminal E3 of the bipolar transistor Q3 through a resistive element R14. An emitter terminal E7 (first emitter terminal) of the bipolar transistor Q7 is grounded.

A base terminal B8 (second base terminal) of the bipolar transistor Q8 (second bipolar transistor) is connected to a collector terminal C8 of the bipolar transistor Q8. The collector terminal C8 (second collector terminal) of the bipolar transistor Q8 is connected to the emitter terminal E4 of the bipolar transistor Q4. An emitter terminal E8 (second emitter terminal) of the bipolar transistor Q8 is grounded.

The resistive element R13 is connected in series between the emitter terminal E3 of the bipolar transistor Q3 and the base terminal B7 of the bipolar transistor Q7. The resistive element R14 is connected in series between the emitter terminal E3 of the bipolar transistor Q3 and the collector terminal C7 of the bipolar transistor Q7.

Even in the bias circuit 70, similarly to the bias circuit 10, a bias voltage of the base terminal B7 of the bipolar transistor Q7 increases through the resistive element R13 when the bias voltage of the emitter terminal E3 of the bipolar transistor Q3 increases as the output of the amplifier 50 increases. As a result, the bipolar transistor Q7 enters an ON state. Thus, a current flows in the bipolar transistor Q7, thereby helping to prevent the bias voltage of the emitter terminal E3 of the bipolar transistor Q3 from increasing.

Figure 8:
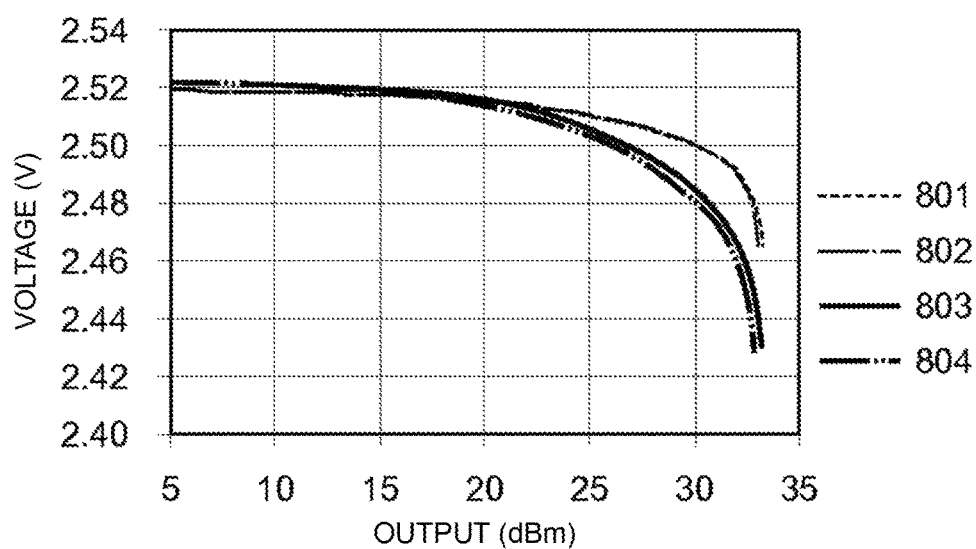
FIG. 8 is a graph illustrating, regarding bias circuits and amplifiers associated with the third embodiment and the comparison example, a relationship between a bias voltage of a bipolar transistor of each bias circuit and the output of a corresponding one of the amplifiers.

FIG. 8 is a graph illustrating, regarding amplifiers and bias circuits, a relationship between the output of each amplifier and a bias voltage of a corresponding one of the bias circuits. The horizontal axis of FIG. 8 represents the output of each amplifier, and the vertical axis of FIG. 8 represents the bias voltage of each bias circuit. Reference numerals 801 and 802 indicate a relationship between the output of the amplifier 60 according to the comparison example illustrated in FIG. 6 and the bias voltage of the base terminal B11 of the bipolar transistor Q11 of the bias circuit 30. In particular, the reference numeral 801 indicates a graph for the case where the frequency of the RF signal is 824 MHz, and the reference numeral 802 indicates a graph for the case where the frequency of the RF signal is 915 MHz. In contrast, reference numerals 803 and 804 indicate a relationship between the output of the amplifier 50 according to the third embodiment illustrated in FIG. 7 and a bias voltage of the base terminal B3 of the bipolar transistor Q3 of the bias circuit 70. In particular, the reference numeral 803 indicates a graph for the case where the frequency of the RF signal is 824 MHz, and the reference numeral 804 indicates a graph for the case where the frequency of the RF signal is 915 MHz.

Similarly to the graph illustrated in FIG. 2, these results show that, in the graphs indicated by the reference numerals 803 and 804 according to the third embodiment, the bias voltages of the base terminal of the bias circuit decrease slightly more sharply as the level of the output of the amplifier increases than in the graphs indicated by the reference numerals 801 and 802 according to the comparison example.

Figure 9:
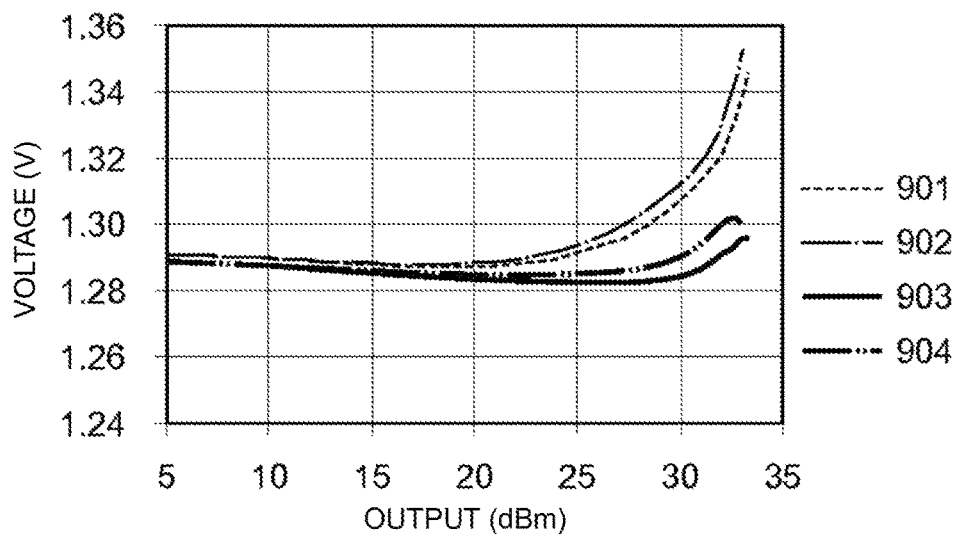
FIG. 9 is a graph illustrating, regarding the bias circuits and amplifiers associated with the third embodiment and the comparison example, a relationship between a bias voltage of a bipolar transistor of each bias circuit and the output of a corresponding one of the amplifiers.

FIG. 9 is a graph illustrating, regarding amplifiers and bias circuits, a relationship between the output of each amplifier and a bias voltage of a corresponding one of the bias circuits. The horizontal axis of FIG. 9 represents the output of each amplifier, and the vertical axis of FIG. 9 represents the bias voltage of each bias circuit. Reference numerals 901 and 902 indicate a relationship between the output of the amplifier 60 according to the comparison example illustrated in FIG. 6 and a bias voltage of the emitter terminal E11 of the bipolar transistor Q11 of the bias circuit 30. In particular, the reference numeral 901 indicates a graph for the case where the frequency of the RF signal is 824 MHz, and the reference numeral 902 indicates a graph for the case where the frequency of the RF signal is 915 MHz. In contrast, reference numerals 903 and 904 indicate a relationship between the output of the amplifier 50 according to the third embodiment illustrated in FIG. 7 and the bias voltage of the emitter terminal E3 of the bipolar transistor Q3 of the bias circuit 70. In particular, the reference numeral 903 indicates a graph for the case where the frequency of the RF signal is 824 MHz, and the reference numeral 904 indicates a graph for the case where the frequency of the RF signal is 915 MHz.

These results show that, in the graphs indicated by the reference numerals 903 and 904 according to the third embodiment, the bias voltages gradually decrease as the output of the amplifier 50 increases in its low and middle output region. In addition, these results also show that, in the graphs indicated by the reference numerals 903 and 904 according to the third embodiment, the bias voltages turn to an increase pattern in the high output region of the amplifier 50; however, the bias voltages do not increase as much as those in the graphs indicated by the reference numerals 901 and 902 according to the comparison example. Similarly to as in the power amplifier 100, this is because the bias voltage of the base terminal B7 of the bipolar transistor Q7 increases through the resistive element R13 when the bias voltage of the emitter terminal E3 of the bipolar transistor Q3 increases as the output of the amplifier 50 increases. As a result, compared with the comparison example, the bipolar transistor Q7 entering the ON state helps to prevent the bias voltage of the emitter terminal E3 of the bipolar transistor Q3 from increasing.

Figure 10:
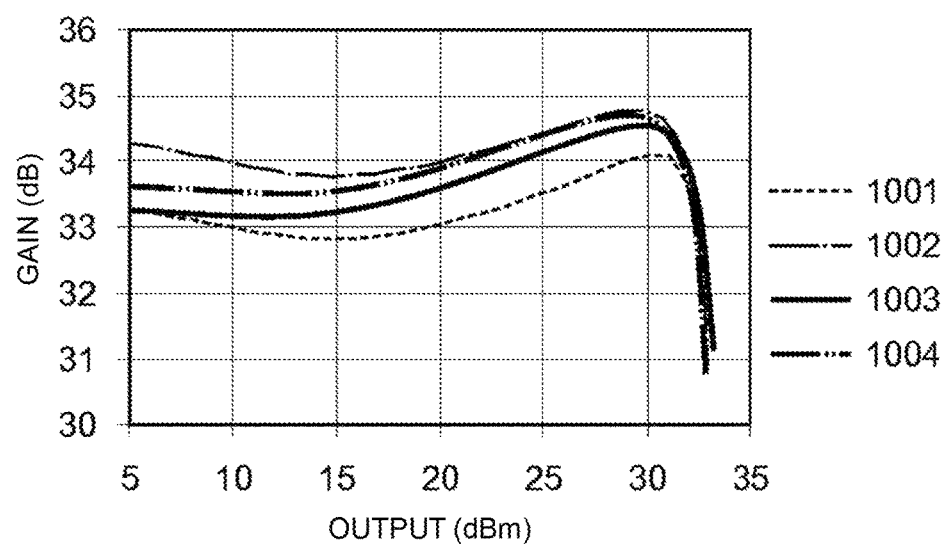
FIG. 10 is a graph illustrating, regarding the amplifiers associated with the third embodiment and the comparison example, a relationship between the gain and output of each amplifier.

FIG. 10 is a graph illustrating, regarding amplifiers, a relationship between the output and gain of each amplifier. The horizontal axis of FIG. 10 represents the output of each amplifier, and the vertical axis of FIG. 10 represents the gain of each amplifier. Reference numerals 1001 and 1002 indicate a relationship between the output and gain of the amplifier 60 according to the comparison example illustrated in FIG. 6. In particular, the reference numeral 1001 indicates a graph for the case where the frequency of the RF signal is 824 MHz, and the reference numeral 1002 indicates a graph for the case where the frequency of the RF signal is 915 MHz. Reference numerals 1003 and 1004 indicate a relationship between the output and gain of the amplifier 50 according to the third embodiment illustrated in FIG. 7. In particular, the reference numeral 1003 indicates a graph for the case where the frequency of the RF signal is 824 MHz, and the reference numeral 1004 indicates a graph for the case where the frequency of the RF signal is 915 MHz.

As illustrated in the graphs indicated by the reference numerals 1003 and 1004, changes in the gain of the amplifier 50 due to increases in the output of the amplifier 50 are smaller than changes in the gain of the amplifier 60 due to increases in the output of the amplifier 60. As illustrated in the graphs indicated by the reference numerals 903 and 904, this is caused by small changes in the bias voltage of the emitter terminal E3 of the bipolar transistor Q3 even in the case where the output of the amplifier 50 increases. According to the third embodiment, the deterioration of the linearity of the amplifier 50 caused by changes in the gain of the amplifier 50 in its low and middle output region may be prevented in this manner similarly to as in the first embodiment.

According to the bias circuit 70 according to the third embodiment, when the bias voltage of the emitter terminal E3 of the bipolar transistor Q3 increases as the output of the amplifier 50 increases, the bias voltage of the base terminal B7 of the bipolar transistor Q7 increases, and thus the bipolar transistor Q7 enters the ON state. As a result, similarly to as in the first embodiment, the bias voltage of the emitter terminal E3 of the bipolar transistor Q3 may be prevented from increasing as the output of the amplifier 50 increases, and by extension the nonlinear operation of the amplifier 50 may be improved. In addition, the bias circuit 70 may be manufactured so as to have a simpler configuration than the bias circuit 10 forming the negative feedback including the bipolar transistors Q2 and Q4.

Note that, similarly to the bias circuit 20 illustrated in FIG. 5, the bias circuit 70 illustrated in FIG. 7 may include field-effect transistors instead of the bipolar transistors Q3 and Q4. In addition, the bias circuit 70 does not have to include the resistive element R14.

The embodiments above are described to facilitate understanding of the present invention, and do not intend to limit the scope of the present invention. The present invention may be modified or improved without departing from the gist thereof, and the present invention also includes equivalents thereto. That is, embodiments obtained by adding design changes to the above-described embodiments as necessary by those skilled in the art also fall within the scope of the present invention as long as the resulting embodiments have characteristics of the present invention. For example, the circuit elements included in the embodiments and the arrangement of the circuit elements are not limited to those shown by example and may be changed as necessary. For example, an expression "a circuit element A is connected to a circuit element B" may include not only the case where the circuit element A is directly connected to the circuit element B but also the case where a signal path is selectively established via a circuit element C (for example, a switch element) between the circuit element A and the circuit element B. In addition, some or all of the circuit elements included in the embodiments may be combined as long as the combinations are technically possible, and the resulting combinations also fall within the scope of the present invention as long as the combinations include characteristics of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A bias circuit comprising:
a first bipolar transistor that has a first collector terminal, a first emitter terminal, and a first base terminal, wherein the first collector terminal is connected to a power source terminal through a first current path and the first emitter terminal is grounded;
a second bipolar transistor that has a second collector terminal, a second emitter terminal, and a second base terminal, wherein the second collector terminal is connected to a constant voltage source or a constant current source through a second current path, the second emitter terminal is grounded, and the second base terminal is connected to the first base terminal;
a third bipolar transistor that has a third base terminal, a third collector terminal, and a third emitter terminal, wherein the third collector terminal is connected to the power source terminal through the first current path, and the third emitter terminal is connected to the first collector terminal through the first current path and supplies a bias signal to an amplifier;
a fourth bipolar transistor that has a fourth base terminal, a fourth collector terminal, and a fourth emitter terminal, wherein the fourth base terminal is connected to the third base terminal, the fourth collector terminal is connected to the constant voltage source or the constant current source through the second current path, the fourth emitter terminal is connected to the second collector terminal through the second current path, and the fourth collector terminal is connected to the fourth base terminal; and
a filter circuit that is connected between the first collector terminal and ground through the first base terminal, wherein the filter circuit and is configured to have a frequency characteristic that attenuates a high frequency component of a radio frequency signal input to the amplifier.

2. The bias circuit according to claim 1, wherein the filter circuit constitutes a low pass filter.

3. The bias circuit according to claim 2, wherein the low pass filter comprises a resistive element and a capacitive element.

4. The bias circuit according to claim 3, wherein the resistive element is connected between the first collector terminal and the first base terminal, and the capacitive element is connected between the first base terminal and ground.

* * * * *